(12) United States Patent
Shiokawa

(10) Patent No.: US 10,389,329 B2
(45) Date of Patent: Aug. 20, 2019

(54) MULTILAYER ELECTRONIC COMPONENT AND MULTILAYER LC FILTER

(71) Applicant: Murata Manufacturing Co., Ltd., Nagaokakyo-shi, Kyoto-fu (JP)

(72) Inventor: Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/834,148

(22) Filed: Dec. 7, 2017

(65) Prior Publication Data

US 2018/0226940 A1 Aug. 9, 2018

(30) Foreign Application Priority Data

Feb. 3, 2017 (JP) .................. 2017-018217
Aug. 29, 2017 (JP) .................. 2017-164010

(51) Int. Cl.
| | | |
|---|---|---|
| *H03H 7/01* | (2006.01) | |
| *H03H 1/00* | (2006.01) | |
| *H01F 27/28* | (2006.01) | |
| *H01F 27/40* | (2006.01) | |
| *H01G 4/30* | (2006.01) | |
| *H01G 4/40* | (2006.01) | |

(Continued)

(52) U.S. Cl.
CPC ........... *H03H 7/17* (2013.01); *H01F 17/0013* (2013.01); *H01F 27/2804* (2013.01); *H01F 27/323* (2013.01); *H01F 27/40* (2013.01); *H01F 41/041* (2013.01); *H01F 41/122* (2013.01); *H01G 4/012* (2013.01); *H01G 4/30* (2013.01); *H01G 4/40* (2013.01); *H03H 1/00* (2013.01); *H03H 3/00* (2013.01); *H03H 7/0115* (2013.01); *H03H 7/1758* (2013.01); *H01F 2017/004* (2013.01); *H01F 2017/0026* (2013.01); *H01F 2027/2809* (2013.01); *H03H 2001/0085* (2013.01)

(58) Field of Classification Search
CPC ...... H03H 7/1758; H03H 7/0115; H03H 7/01; H03H 7/17; H03H 2001/0078; H03H 2001/0085; H01F 2017/0026; H01F 2017/004
USPC .................................................. 333/175, 185
See application file for complete search history.

(56) References Cited

U.S. PATENT DOCUMENTS

| | | | |
|---|---|---|---|
| 7,002,434 B2 * | 2/2006 | Lin ...................... | H03H 7/09 333/167 |
| 2013/0200979 A1 * | 8/2013 | Yokoyama .......... | H01F 17/0013 336/200 |

(Continued)

FOREIGN PATENT DOCUMENTS

| | | |
|---|---|---|
| JP | 2003-309011 A | 10/2003 |
| WO | 2016/152205 A1 | 9/2016 |

*Primary Examiner* — Stephen E. Jones
(74) *Attorney, Agent, or Firm* — Keating & Bennett, LLP

(57) ABSTRACT

A multilayer electronic component includes a multilayer body including insulator layers that are stacked, linear conductor traces each provided between adjacent ones of the insulator layers, and via conductors. A helical or substantially helical inductor is provided in the multilayer body. When viewed in the stacking direction of the multilayer body, all of the linear conductor traces, except a portion of one linear conductor trace, are superimposed within an annular or substantially annular linear conductor trace region. The portion of the one linear conductor trace is displaced inwardly from the annular or substantially annular linear conductor trace region.

20 Claims, 17 Drawing Sheets

(51) Int. Cl.
*H03H 3/00* (2006.01)
*H01F 27/32* (2006.01)
*H01F 41/12* (2006.01)
*H01F 41/04* (2006.01)
*H01G 4/012* (2006.01)
*H01F 17/00* (2006.01)

(56) References Cited

U.S. PATENT DOCUMENTS

2015/0116966 A1* 4/2015 Lee .................. H01G 4/40
　　　　　　　　　　　　　　　　　　　　　　361/767
2017/0170798 A1　6/2017 Masuda

* cited by examiner

MULTILAYER ELECTRONIC COMPONENT AND MULTILAYER LC FILTER

CROSS REFERENCE TO RELATED APPLICATIONS

This application claims the benefit of priority to Japanese Patent Application No. 2017-164010 filed on Aug. 29, 2017 and Japanese Patent Application No. 2017-018217 filed on Feb. 3, 2017. The entire contents of these applications are hereby incorporated herein by reference.

BACKGROUND OF THE INVENTION

1. Field of the Invention

The present invention relates to multilayer electronic components, and particularly, to a multilayer electronic component that includes an inductor with a high quality factor (Q value) and that has a low insertion loss, and a method for manufacturing such a multilayer electronic component.

2. Description of the Related Art

International Publication No. WO2016/152205 A1 discloses a multilayer electronic component in which an inductor is formed in a multilayer body obtained by stacking a plurality of insulator layers.

FIG. 16 illustrates a multilayer electronic component (low pass filter) 1100 disclosed in International Publication No. WO2016/152205 A1. Note that FIG. 16 is an exploded perspective view illustrating a main portion, which is an inductor portion, of the multilayer electronic component 1100 disclosed in International Publication No. WO2016/152205 A1, and the illustration of a capacitor portion is omitted.

The multilayer electronic component 1100 includes a multilayer body 102 formed by stacking insulator layers 101a to 101i and a plurality of other insulator layers (not shown).

The insulator layer 101a at the top of the stack is a protective layer.

Linear conductor traces (inductor conductor layers) 103a and 104a are formed on the upper principal surface of the insulator layer 101b, which is the second layer from the top of the stack. A first end of the linear conductor trace 103a and a first end of the linear conductor trace 104a are interconnected.

Linear conductor traces 103b and 104b are formed on the upper principal surface of the insulator layer 101c, which is the third layer from the top of the stack. A first end of the linear conductor trace 103b and a first end of the linear conductor trace 104b are interconnected.

Linear conductor traces 103c and 104c are formed on the upper principal surface of the insulator layer 101d, which is the fourth layer from the top of the stack.

Linear conductor traces 103d and 104d are formed on the upper principal surface of the insulator layer 101e, which is the fifth layer from the top of the stack.

Linear conductor traces 103e and 104e are formed on the upper principal surface of the insulator layer 101f, which is the sixth layer from the top of the stack.

Linear conductor traces 103f and 104f are formed on the upper principal surface of the insulator layer 101g, which is the seventh layer from the top of the stack.

Linear conductor traces 103g and 104g are formed on the upper principal surface of the insulator layer 101h, which is the eighth layer from the top of the stack.

Linear conductor traces 103h and 104h are formed on the upper principal surface of the insulator layer 101i, which is the ninth layer from the top of the stack.

Via conductors (via hole conductors) 105a to 105f and other via conductors (not denoted by reference numerals) are formed in the multilayer body 102.

In the multilayer electronic component 1100, the linear conductor traces 103a to 103h are connected by the via conductors 105a to 105c to define an inductor 106.

The inductor 106 is formed by turns each formed by a set of linear conductor traces on about two vertically adjacent layers. Specifically, a pair of the linear conductor traces 103a and 103b, a pair of the linear conductor traces 103c and 103d, a pair of the linear conductor traces 103e and 103f, and a pair of the linear conductor traces 103g and 103h form respective turns, which are connected by the via conductors 105a to 105c to form the inductor 106. As described above, each turn is formed by a pair of linear conductor traces. This is to reduce internal resistance and increase the quality factor of the inductor 106. A more detailed configuration of the inductor 106 is as follows.

Second ends of the linear conductor traces 103a and 103b and first ends of the linear conductor traces 103c and 103d are connected by the via conductor 105a. Second ends of the linear conductor traces 103c and 103d and first ends of the linear conductor traces 103e and 103f are connected by the via conductor 105b. Second ends of the linear conductor traces 103e and 103f and first ends of the linear conductor traces 103g and 103h are connected by the via conductor 105c. The inductor 106 is thus formed.

Also in the multilayer electronic component 1100, the linear conductor traces 104a to 104h are connected by the via conductors 105d to 105f to form another inductor 107. The inductor 107 is also formed by turns each formed by a set of linear conductor traces on about two vertically adjacent layers. A more detailed configuration of the inductor 107 is as follows.

Second ends of the linear conductor traces 104a and 104b and first ends of the linear conductor traces 104c and 104d are connected by the via conductor 105d. Second ends of the linear conductor traces 104c and 104d and first ends of the linear conductor traces 104e and 104f are connected by the via conductor 105e. Second ends of the linear conductor traces 104e and 104f and first ends of the linear conductor traces 104g and 104h are connected by the via conductor 105f. The inductor 107 is thus formed.

When the multilayer electronic component 1100 is viewed in the stacking direction of the multilayer body 102, the linear conductor traces 103a to 103h forming the inductor 106 are superimposed on top of one another. Similarly, the linear conductor traces 104a to 104h forming the inductor 107 are superimposed on top of one another.

Japanese Unexamined Patent Application Publication No. 2003-309011 discloses another multilayer electronic component in which an inductor is formed in a multilayer body obtained by stacking a plurality of insulator layers.

FIGS. 17A and 17B illustrate a multilayer electronic component (multilayer inductor) 1200 disclosed in Japanese Unexamined Patent Application Publication No. 2003-309011. FIG. 17A is a transparent perspective view of the multilayer electronic component 1200, and FIG. 17B is an exploded perspective view of a main portion of the multilayer electronic component 1200.

The multilayer electronic component 1200 includes a multilayer body (insulating multilayer body) 201. The multilayer body 201 includes a plurality of insulator layers (insulating sheets) 202a to 202e that are stacked in this order from the bottom and another insulator layer (not shown), which serves as a protective layer, is disposed at the top of the stack.

An extended terminal 203 is formed on the upper principal surface of the insulator layer 202a. A linear conductor trace (conductor trace) 204a is formed on the upper principal surface of the insulator layer 202b, a linear conductor trace 204b is formed on the upper principal surface of the insulator layer 202c, a linear conductor trace 204c is formed on the upper principal surface of the insulator layer 202d, and a linear conductor trace 204d is formed on the upper principal surface of the insulator layer 202e.

The linear conductor traces 204a to 204d are substantially annular traces. The linear conductor traces 204a to 204d share the same central axis, but have different diameters.

The multilayer body 201 has via conductors (through holes) 205a to 205d formed therein.

The extended terminal 203 and the linear conductor trace 204a are connected by the via conductor 205a. The linear conductor traces 204a and 204b are connected by the via conductor 205b. The linear conductor traces 204b and 204c are connected by the via conductor 205c. The linear conductor traces 204c and 204d are connected by the via conductor 205d.

An inductor is thus formed in the multilayer electronic component 1200 by a conductive path that connects the linear conductor trace 204a, the via conductor 205b, the linear conductor trace 204b, the via conductor 205c, the linear conductor trace 204c, the via conductor 205d, and the linear conductor trace 204d in this order.

Since the linear conductor traces 204a to 204d have different diameters as described above, they are not superimposed when the multilayer electronic component 1200 is viewed in the stacking direction of the multilayer body 201.

In the multilayer electronic component 1100 disclosed in International Publication No. WO2016/152205 A1, the inductor 106 has a low quality factor because the linear conductor traces 103a and 103h forming the inductor 106 are vertically superimposed. More specifically, since the linear conductor traces 103a and 103h are vertically superimposed, the quality factor of the inductor 106 is reduced by capacitance formed between the linear conductor traces 103b and 103c, between the linear conductor traces 103d and 103e, and between the linear conductor traces 103f and 103g.

Similarly, in the multilayer electronic component 1100, the inductor 107 has a low quality factor because the linear conductor traces 104a to 104h forming the inductor 107 are vertically superimposed. More specifically, since the linear conductor traces 104a to 104h are vertically superimposed, the quality factor of the inductor 107 is reduced by capacitance formed between the linear conductor traces 104b and 104c, between the linear conductor traces 104d and 104e, and between the linear conductor traces 104f and 104g.

The multilayer electronic component 1100 suffers a high insertion loss (IL) due to the low quality factors of the inductors 106 and 107.

In the multilayer electronic component 1200 disclosed in Japanese Unexamined Patent Application Publication No. 2003-309011, the linear conductor traces 204a to 204d have different diameters. This creates dead spaces around, for example, the linear conductor traces 204a and 204b with smaller diameters, and increases the size of the multilayer electronic component 1200 in the planar direction. That is, to form an inductor with the same inductance value, the multilayer electronic component 1200 needs to be larger in size in the planar direction than a multilayer electronic component that includes a plurality of linear conductor traces of the same diameter.

Also, since the linear conductor traces 204a to 204d forming an inductor are not superimposed, the self-resonant frequency of the multilayer electronic component 1200 is too high. That is, unlike the multilayer electronic component 1100 described in International Publication No. WO2016/152205 A1, the multilayer electronic component 1200 includes the linear conductor traces 204a to 204d that are not superimposed. Thus, since there is very little capacitance between adjacent ones of the linear conductor traces 204a to 204d, the self-resonant frequency of the multilayer electronic component 1200 is too high.

SUMMARY OF THE INVENTION

A multilayer electronic component according to a preferred embodiment of the present invention includes a multilayer body including a plurality of insulator layers that are stacked, a plurality of linear conductor traces each provided between two adjacent ones of the plurality of insulator layers, and a plurality of via conductors each passing through at least a corresponding one of the plurality of insulator layers. The plurality of linear conductor traces are connected by corresponding ones of the plurality of via conductors to provide a helical or substantially helical inductor in the multilayer body. When viewed in the stacking direction of the multilayer body, all of the plurality of linear conductor traces, except at least one linear conductor trace, are superimposed within a predetermined annular or substantially annular linear conductor trace region, and a portion of the at least one linear conductor trace is displaced inwardly or outwardly from the annular or substantially annular linear conductor trace region, and the remaining portion of the at least one linear conductor trace is disposed within the annular or substantially annular linear conductor trace region.

In a multilayer electronic component according to a preferred embodiment of the present invention, it is preferable that a plurality of helical or substantially helical inductors be provided in the multilayer body. With the plurality of inductors, a multilayer electronic component with high functionality is provided.

It is preferable that a multilayer electronic component according to a preferred embodiment of the present invention further includes a plurality of capacitor conductor traces. Two opposite ones of the plurality of capacitor conductor traces preferably define at least one capacitor. When viewed in a direction perpendicular or substantially perpendicular to the stacking direction of the multilayer body, the capacitor is preferably disposed above or below a portion where the inductor is provided. With this capacitor, a multilayer electronic component with high functionality is provided.

In a multilayer electronic component according to a preferred embodiment of the present invention, when viewed in the direction perpendicular or substantially perpendicular to the stacking direction of the multilayer body, a portion of the linear conductor trace disposed closest to the capacitor conductor traces defining the capacitor may preferably be displaced inwardly or outwardly from the annular or substantially annular linear conductor trace region. Alternatively, when viewed in the direction perpendicular or substantially perpendicular to the stacking direction of the multilayer body, a portion of the linear conductor trace spaced from the capacitor conductor traces defining the capacitor, with at least one linear conductor trace interposed therebetween, may preferably be displaced inwardly or outwardly from the annular or substantially annular linear conductor trace region. In both of these cases, it is possible to reduce or prevent the occurrence of unwanted capacitance between adjacent ones of the linear conductor traces defining the inductor, and reduce or prevent a reduction in the quality factor of the inductor. By reducing or preventing the reduction in the quality factor of the inductor, an insertion loss of the multilayer electronic component is reduced.

In a multilayer electronic component according to a preferred embodiment of the present invention, when viewed in the stacking direction of the multilayer body, preferably, the multilayer body may be rectangular or substantially rectangular in shape, the capacitor may be eccentrically located to one side of the rectangular or substantially rectangular multilayer body, and on the one side of the multilayer body to which the capacitor is eccentrically located, the portion of the at least one linear conductor trace may be displaced inwardly or outwardly from the annular or substantially annular linear conductor trace region. Alternatively, when viewed in the stacking direction of the multilayer body, preferably, the multilayer body may be rectangular or substantially rectangular in shape, the capacitor is eccentrically located to one side of the rectangular or substantially rectangular multilayer body, and on a side opposite the one side of the multilayer body to which the capacitor is eccentrically located (i.e., on the side to which the capacitor is not eccentrically located), the portion of the at least one linear conductor trace may be displaced inwardly or outwardly from the annular or substantially annular linear conductor trace region. In both of these cases, it is possible to reduce or prevent the occurrence of unwanted capacitance between adjacent ones of the linear conductor traces defining the inductor, and reduce or prevent a reduction in the quality factor of the inductor. By reducing or preventing the reduction in the quality factor of the inductor, an insertion loss of the multilayer electronic component is reduced.

A multilayer LC filter, such as a high pass filter, a band pass filter, or a low pass filter, may be defined by the multilayer electronic component according to any of the preferred embodiments of the present invention.

In multilayer electronic components according to various preferred embodiments of the present invention, when viewed in the stacking direction of the multilayer body, a portion of at least one linear conductor trace is displaced inwardly or outwardly from the annular or substantially annular linear conductor trace region. This reduces or prevents the occurrence of unwanted capacitance between adjacent ones of the linear conductor traces defining the inductor, and reduces or prevents a reduction in the quality factor of the inductor. That is, since the area where the linear conductor trace which is partially displaced and another linear conductor trace are superimposed is reduced, the capacitance produced between them is reduced, and a reduction in the quality factor of the inductor is reduced or prevented. Therefore, multilayer electronic components according to various preferred embodiments of the present invention have a low insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
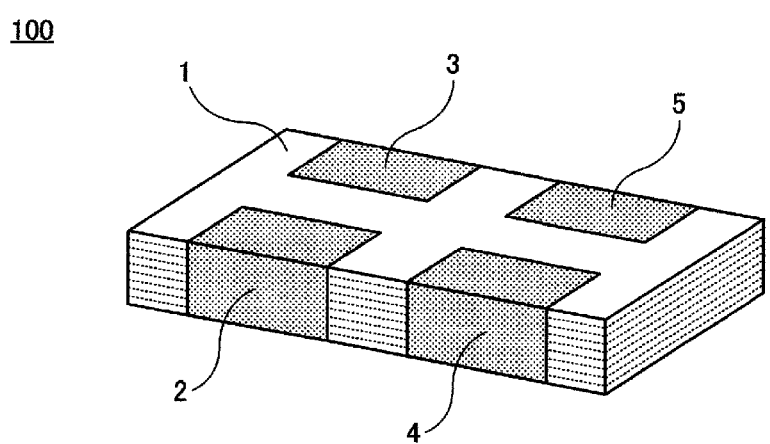
FIG. 1 is a perspective view of a multilayer electronic component according to a first preferred embodiment of the present invention.

Preferred embodiments of the present invention will now be described with reference to the drawings.

The preferred embodiments described herein are merely illustrations of the present invention, and the present invention is not limited to the preferred embodiments described herein. Elements described in different preferred embodiments may be implemented in a combined manner, and such combinations are also included in the present invention. The drawings may be schematic, as they are provided to facilitate understanding of the description. This means that the dimensions of elements, or the ratios between the dimensions of elements, in the drawings may differ from those in the description. Also, the elements mentioned in the description may be omitted or reduced in number in the drawings.

First Preferred Embodiment

Figure 2:
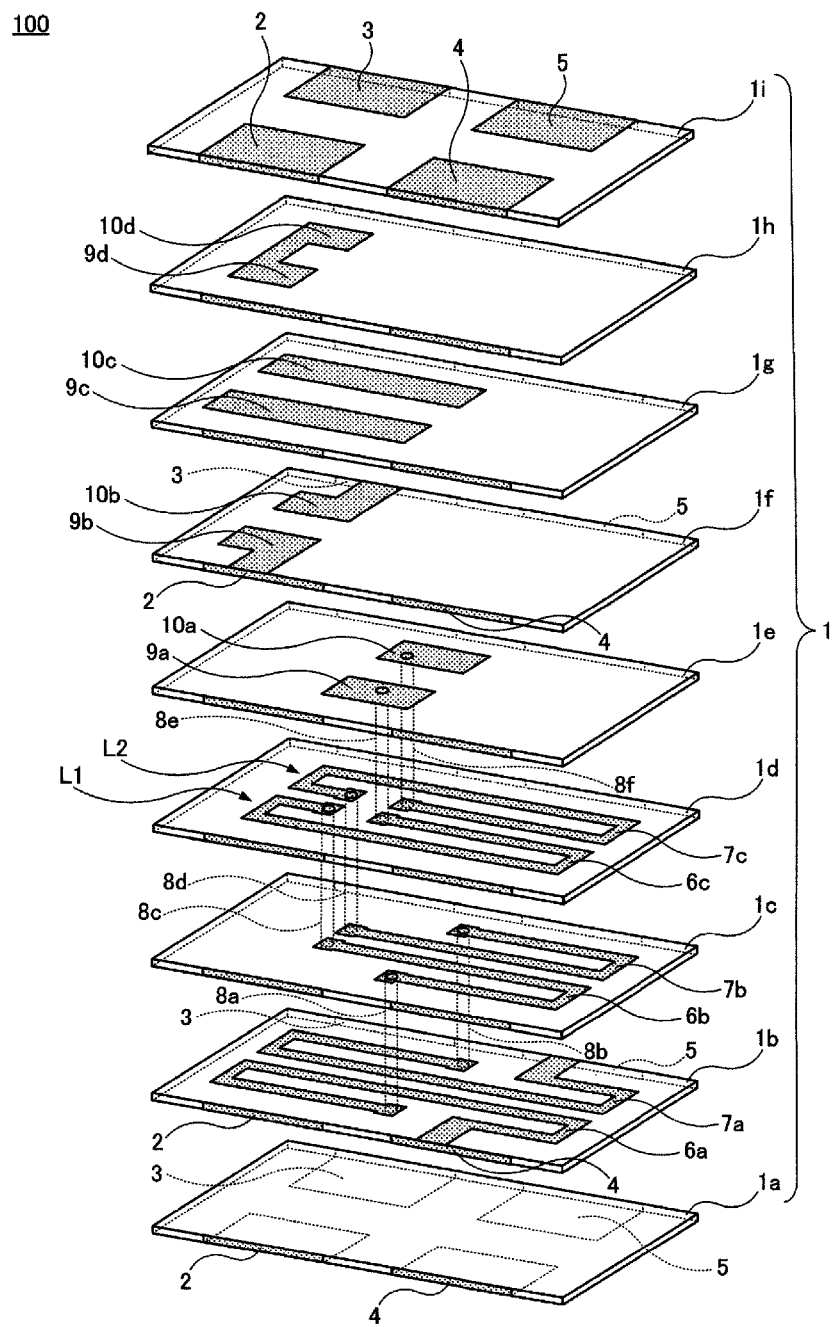
FIG. 2 is an exploded perspective view of the multilayer electronic component according to the first preferred embodiment of the present invention.
Figure 3:
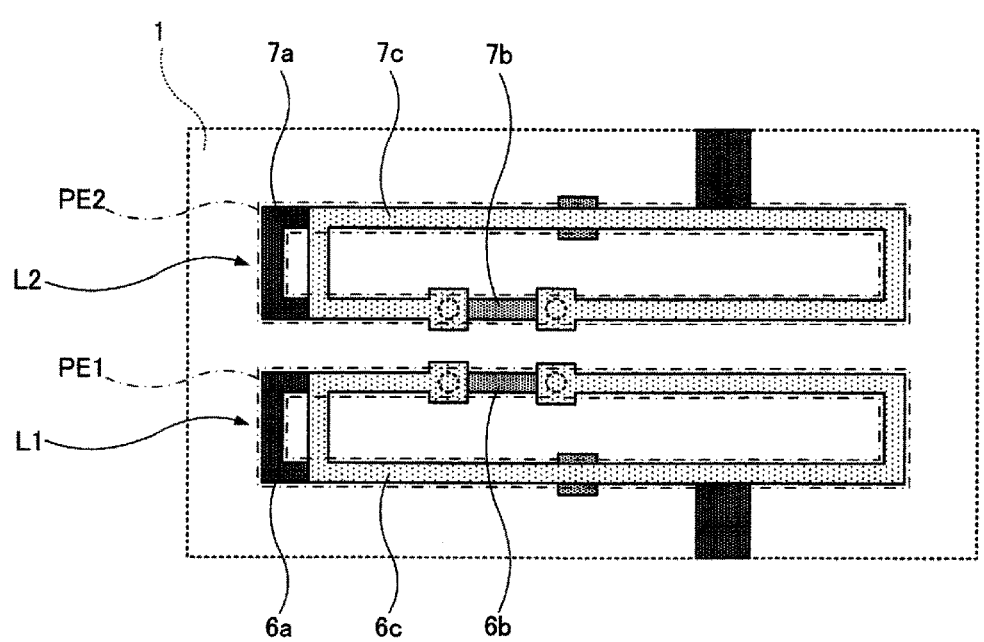
FIG. 3 is a perspective plan view of the multilayer electronic component according to the first preferred embodiment of the present invention.
Figure 4:
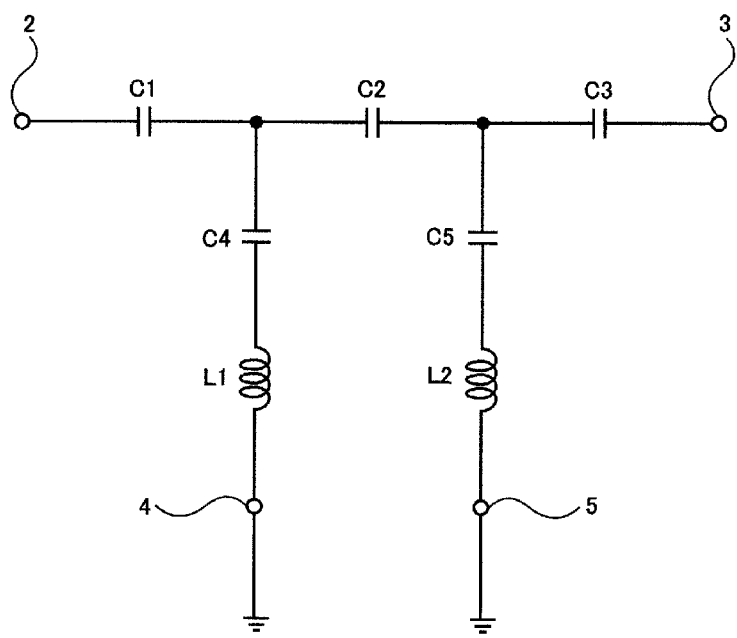
FIG. 4 is an equivalent circuit diagram of the multilayer electronic component according to the first preferred embodiment of the present invention.

FIGS. 1 to 4 illustrate a multilayer electronic component 100 according to a first preferred embodiment of the present invention. FIG. 1 is a perspective view of the multilayer electronic component 100. FIG. 2 is an exploded perspective view of the multilayer electronic component 100. FIG. 3 is a perspective plan view of the multilayer electronic component 100. FIG. 4 is an equivalent circuit diagram of the multilayer electronic component 100.

The multilayer electronic component 100 includes a multilayer body 1. For example, the multilayer body 1 may preferably be made of ceramic that is able to be co-fired with a conductor material.

Input-output terminals 2 and 3 and ground terminals 4 and 5 are provided on the side surface of the multilayer body 1. The input-output terminals 2 and 3 and the ground terminals 4 and 5 are each extended at a first end thereof to the bottom surface of the multilayer body 1, and extended at a second end thereof to the top surface of the multilayer body 1. The input-output terminals 2 and 3 and the ground terminals 4 and 5 are made of a conductor material, such as Cu, for example, and each is provided with one or more plating layers of Ni, Au, Sn, or other suitable material, for example, on the surface thereof. However, the plating layers are optional.

As illustrated in FIG. 2, the multilayer body 1 is obtained by stacking about nine insulator layers 1a to 1i, for example, in this order from the bottom.

The input-output terminals 2 and 3 and the ground terminals 4 and 5 are provided on the lower principal surface of the insulator layer 1a. The input-output terminals 2 and 3 and the ground terminals 4 and 5 are also provided on the side surface of the insulator layer 1a. Although the input-output terminals 2 and 3 and the ground terminals 4 and 5 are also provided on the side surface of each of the insulator layers 1b to 1i (described below), reference numerals in the drawings and the description thereof may be omitted unless otherwise required.

The input-output terminals 2 and 3 and the ground terminals 4 and 5 are provided on the side surface of the insulator layer 1b. Linear conductor traces 6a and 7a are provided on the upper principal surface of the insulator layer 1b. The linear conductor trace 6a is connected at a first end thereof to the ground terminal 4, and the linear conductor trace 7a is connected at a first end thereof to the ground terminal 5.

Via conductors 8a and 8b pass through the insulator layer 1c. The via conductor 8a is connected to a second end of the linear conductor trace 6a, and the via conductor 8b is connected to a second end of the linear conductor trace 7a. Linear conductor traces 6b and 7b are provided on the upper principal surface of the insulator layer 1c. The linear conductor trace 6b is connected at a first end thereof to the via conductor 8a, and the linear conductor trace 7b is connected at a first end thereof to the via conductor 8b.

Via conductors 8c and 8d pass through the insulator layer 1d. The via conductor 8c is connected to a second end of the linear conductor trace 6b, and the via conductor 8d is connected to a second end of the linear conductor trace 7b. Linear conductor traces 6c and 7c are provided on the upper principal surface of the insulator layer 1d. The linear conductor trace 6c is connected at a first end thereof to the via conductor 8c, and the linear conductor trace 7c is connected at a first end thereof to the via conductor 8d.

Via conductors 8e and 8f pass through the insulator layer 1e. The via conductor 8e is connected to a second end of the linear conductor trace 6c, and the via conductor 8f is connected to a second end of the linear conductor trace 7c. Capacitor conductor traces 9a and 10a are formed on the upper principal surface of the insulator layer 1e. The capacitor conductor trace 9a is connected to the via conductor 8e, and the capacitor conductor trace 10a is connected to the via conductor 8f.

The input-output terminals 2 and 3 and the ground terminals 4 and 5 are provided on the side surface of the insulator layer 1f. Capacitor conductor traces 9b and 10b are provided on the upper principal surface of the insulator layer 1f. The capacitor conductor trace 9b is connected to the input-output terminal 2, and the capacitor conductor trace 10b is connected to the input-output terminal 3.

Capacitor conductor traces 9c and 10c are provided on the upper principal surface of the insulator layer 1g.

Capacitor conductor traces 9d and 10d are provided on the upper principal surface of the insulator layer 1h. The capacitor conductor traces 9d and 10d are interconnected.

In the multilayer electronic component 100, the capacitor conductor traces 9a to 9d and 10a to 10d are eccentrically located to one side (i.e., left-hand side in FIG. 2) of the multilayer body 1.

The input-output terminals 2 and 3 and the ground terminals 4 and 5 are provided on the side surface and the upper principal surface of the insulator layer 1i.

The linear conductor traces 6a to 6c and 7a to 7c, the capacitor conductor traces 9a to 9d and 10a to 10d, and the via conductors 8a to 8f are made of a conductor material, such as Cu, for example.

In the multilayer electronic component 100, as described below, an inductor L1 is defined by a conductive path that connects the via conductor 8e, the linear conductor trace 6c, the via conductor 8c, the linear conductor trace 6b, the via conductor 8a, and the linear conductor trace 6a in this order. Similarly, an inductor L2 is defined by a conductive path that connects the via conductor 8f, the linear conductor trace 7c, the via conductor 8d, the linear conductor trace 7b, the via conductor 8b, and the linear conductor trace 7a in this order.

As described above, FIG. 3 is a perspective plan view of the multilayer electronic component 100. Specifically, FIG. 3 is a perspective view illustrating the linear conductor traces 6a to 6c of the inductor L1 and the linear conductor traces 7a to 7c of the inductor L2, and obtained when the multilayer body 1 (insulator layers 1a to 1i) is viewed in the stacking direction.

When the inductor L1 is viewed in the stacking direction of the multilayer body 1, the linear conductor trace 6a, which is the first trace from the bottom, and the linear conductor trace 6b, which is the second trace from the bottom, are superimposed within a predetermined annular or substantially annular linear conductor trace region PE1 indicated by a dot-and-dash line in FIG. 3.

As for the linear conductor trace 6c, which is the third trace from the bottom, a left-hand portion thereof in FIG. 3 is displaced inwardly from the linear conductor trace region PE1 and the remaining portion thereof is disposed within the annular or substantially annular linear conductor trace region PE1. This is an arrangement used to reduce capacitance between the linear conductor trace 6c and the linear conductor trace 6a, which is the first trace from the bottom.

The linear conductor trace 6c, which is the third trace from the bottom, has been described as being partially displaced inwardly from the linear conductor trace region PE1. In other words, the linear conductor trace 6a, which is the first trace from the bottom, is partially displaced outwardly from a linear conductor trace region (not shown).

Similarly, when the inductor L2 is viewed in the stacking direction of the multilayer body 1, the linear conductor trace 7a, which is the first trace from the bottom, and the linear conductor trace 7b, which is the second trace from the bottom, are superimposed within a predetermined annular or substantially annular linear conductor trace region PE2 indicated by a dot-and-dash line in FIG. 3.

As for the linear conductor trace 7c, which is the third trace from the bottom, a left-hand portion thereof in FIG. 3 is displaced inwardly from the linear conductor trace region PE2 and the remaining portion thereof is disposed within the annular or substantially annular linear conductor trace region PE2. This is an arrangement used to reduce capacitance between the linear conductor trace 7c and the linear conductor trace 7a, which is the first trace from the bottom.

The linear conductor trace 7c, which is the third trace from the bottom, has been described as being partially displaced inwardly from the linear conductor trace region PE2. In other words, the linear conductor trace 7a, which is the first trace from the bottom, is partially displaced outwardly from a linear conductor trace region (not shown).

The multilayer electronic component 100 structured as described above is able to be manufactured by a method that has been commonly used to manufacture multilayer electronic components.

The multilayer electronic component 100 includes the equivalent circuit illustrated in FIG. 4.

The multilayer electronic component 100 includes a pair of input-output terminals 2 and 3.

Preferably, about three capacitors C1, C2, and C3 are connected in this order between the input-output terminals 2 and 3.

A first series resonator defined by a capacitor C4 and the inductor L1 is connected between the node between the capacitors C1 and C2 and the ground. The first series resonator is connected through the ground terminal 4 to the ground.

A second series resonator defined by a capacitor C5 and the inductor L2 is connected between the node between the capacitors C2 and C3 and the ground. The second series resonator is connected through the ground terminal 5 to the ground.

The multilayer electronic component 100 including the equivalent circuit described above is preferably, for example, a multilayer LC filter that defines a high pass filter with a desired frequency response.

A relationship between the equivalent circuit and the structure of the multilayer electronic component 100 will now be described.

The capacitor C1 is defined by capacitance produced between the capacitor conductor traces 9b and 9c. The capacitor conductor trace 9b is connected to the input-output terminal 2.

The capacitor C2 is defined by capacitance produced between the capacitor conductor traces 9c and 9d and also by capacitance produced between the capacitor conductor traces 10d and 10c. The capacitor conductor traces 9d and 10d are interconnected.

The capacitor C3 is defined by capacitance produced between the capacitor conductor traces 10c and 10b. The capacitor conductor trace 10b is connected to the input-output terminal 3.

The capacitor C4 is defined by capacitance produced between the capacitor conductor traces 9c and 9a.

As described above, the inductor L1 is defined by a conductive path that connects the via conductor 8e, the linear conductor trace 6c, the via conductor 8c, the linear conductor trace 6b, the via conductor 8a, and the linear conductor trace 6a in this order. The via conductor 8e is connected to the capacitor conductor trace 9a. The linear conductor trace 6a is connected to the ground terminal 4.

The capacitor C5 is defined by capacitance produced between the capacitor conductor traces 10c and 10a.

As described above, the inductor L2 is defined by a conductive path that connects the via conductor 8f, the linear conductor trace 7c, the via conductor 8d, the linear conductor trace 7b, the via conductor 8b, and the linear conductor trace 7a in this order. The via conductor 8f is connected to the capacitor conductor trace 10a. The linear conductor trace 7a is connected to the ground terminal 5.

With the relationship described above, the multilayer electronic component 100 includes, in the multilayer body 1, a high pass filter circuit defined by the equivalent circuit of FIG. 4 using the capacitors C1 to C5 and the inductors L1 and L2.

When the multilayer electronic component 100 is viewed in the stacking direction of the multilayer body 1, the linear conductor trace 6c of the inductor L1 is displaced inwardly from the linear conductor trace region PE1. With this configuration, as compared to a case in which the linear conductor traces 6a and 6c are completely superimposed, the capacitance generated between the linear conductor traces 6a and 6c is smaller and the quality factor of the inductor L1 is higher.

Similarly, when the multilayer electronic component 100 is viewed in the stacking direction of the multilayer body 1, the linear conductor trace 7c of the inductor L2 is displaced inwardly from the linear conductor trace region PE2. With this configuration, as compared to a case in which the linear conductor traces 7a and 7c are completely superimposed, the capacitance produced between the linear conductor traces 7a and 7c is smaller and the quality factor of the inductor L1 is higher.

Because of the high quality factors of the inductors L1 and L2, the insertion loss of the multilayer electronic component 100 is reduced.

Since there are no dead spaces around the linear conductor traces 6a to 6c and 7a to 7c, the size of the multilayer electronic component 100 in the planar direction is small.

In the multilayer electronic component 100, the linear conductor traces 6a to 6c defining the inductor L1 are superimposed inside the multilayer body 1 and an appropriate amount of capacitance is produced between adjacent ones of the linear conductor traces 6a to 6c. Similarly, the linear conductor traces 7a to 7c defining the inductor L2 are superimposed inside the multilayer body 1 and an appropriate amount of capacitance is produced between adjacent ones of the linear conductor traces 7a to 7c. The multilayer electronic component 100 achieves a desired frequency response using these capacitances, and the resonant frequency thereof is not too high.

Figure 5:
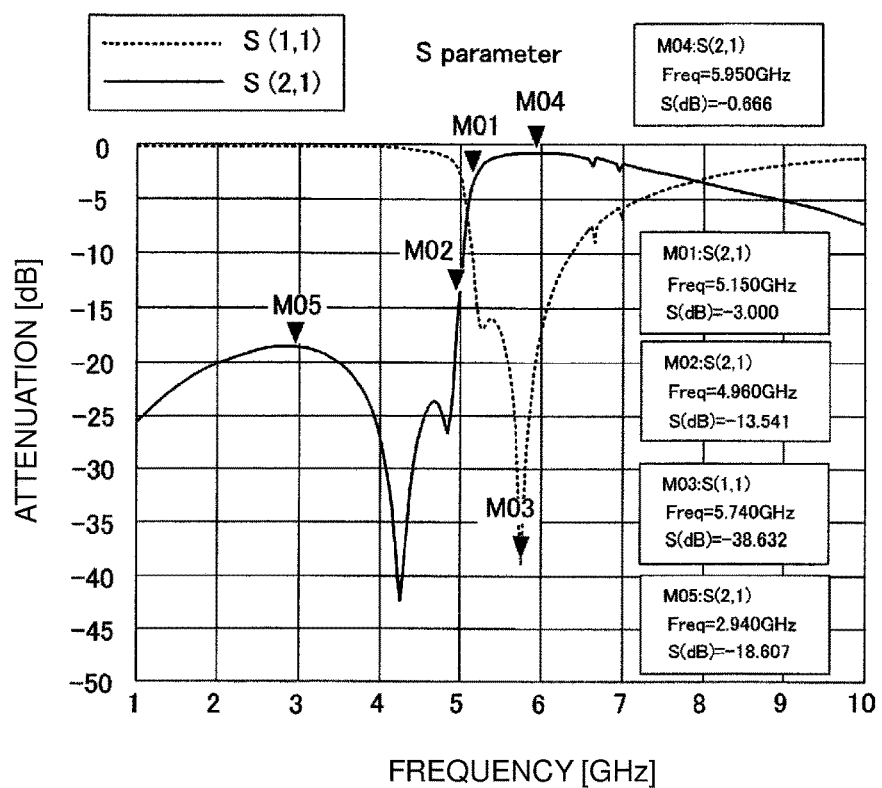
FIG. 5 is a graph showing a frequency response of the multilayer electronic component according to the first preferred embodiment of the present invention.

FIG. 5 shows a frequency response of the multilayer electronic component 100 according to the first preferred embodiment.

Figure 6:
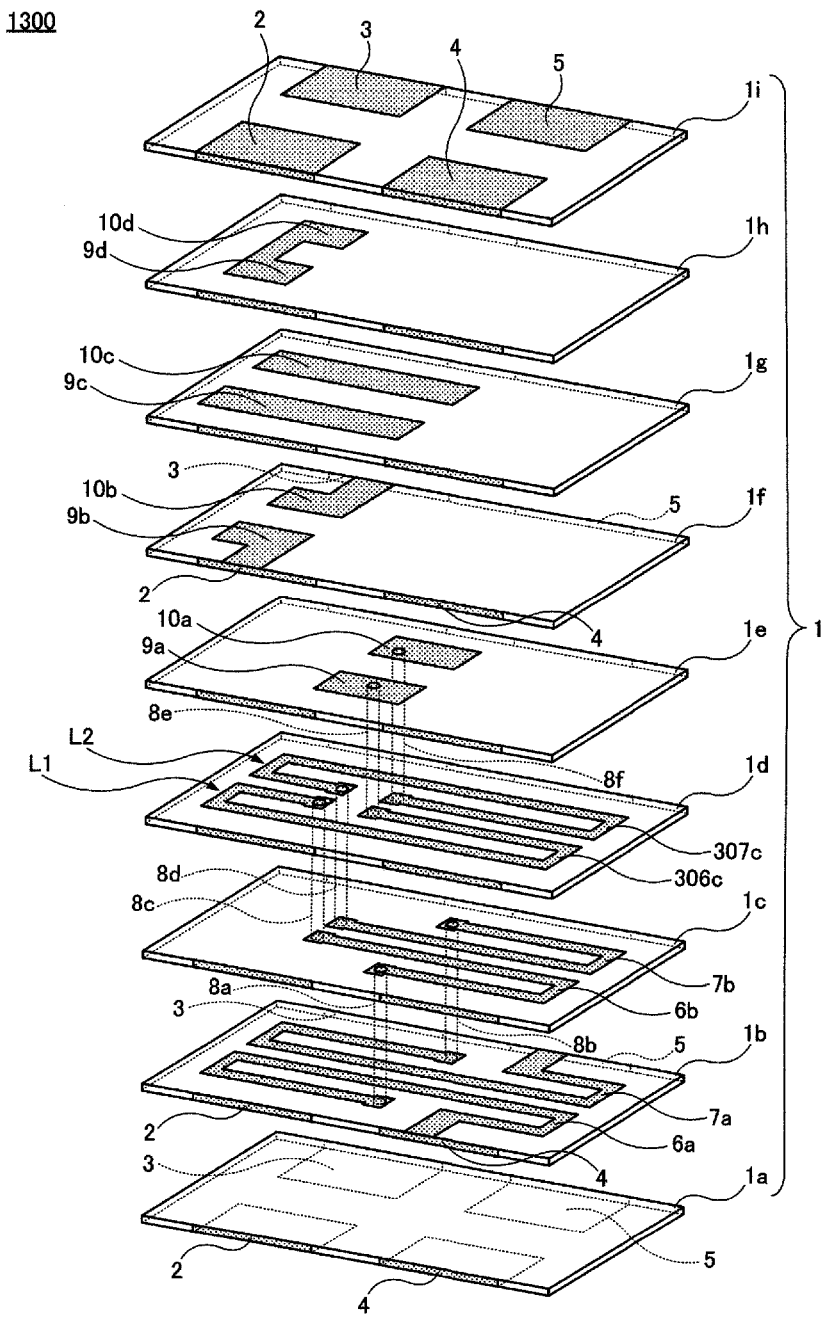
FIG. 6 is an exploded perspective view of a multilayer electronic component according to a comparative example.
Figure 7:
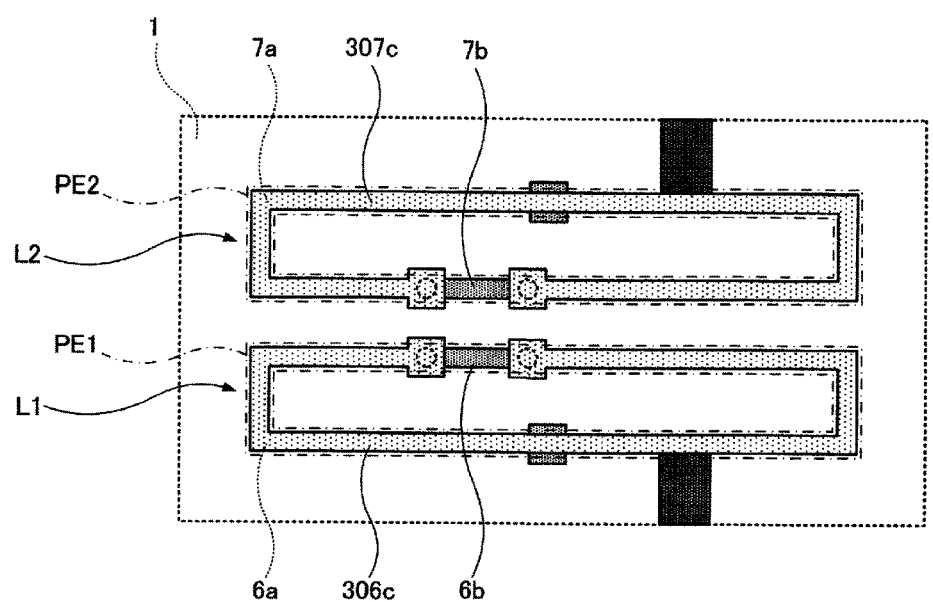
FIG. 7 is a perspective plan view of the multilayer electronic component according to the comparative example.

For comparison, a multilayer electronic component 1300 according to a comparative example was prepared. FIGS. 6 and 7 illustrate the multilayer electronic component 1300. Specifically, FIG. 6 is an exploded perspective view of the multilayer electronic component 1300, and FIG. 7 is a perspective plan view of the multilayer electronic component 1300. In the multilayer electronic component 1300, the same elements as those of the multilayer electronic component 100 are denoted by the same reference numerals, and only elements different from those of the multilayer electronic component 100 are denoted by different reference numerals.

The multilayer electronic component 1300 is obtained by modifying the multilayer electronic component 100. Specifically, in the multilayer electronic component 100, the linear conductor traces 6c and 7c provided on the upper principal surface of the insulator layer 1d are partially displaced inwardly from the linear conductor trace regions PE1 and PE2, respectively. On the other hand, in the multilayer electronic component 1300, the linear conductor traces 306c and 307c provided on the upper principal surface of the insulator layer 1d are located within the linear conductor trace regions PE1 and PE2, respectively. That is, in the multilayer electronic component 1300, the linear conductor traces 306c and 307c are not displaced at all. The remaining configuration of the multilayer electronic component 1300 is the same or substantially the same as that of the multilayer electronic component 100.

Figure 8:
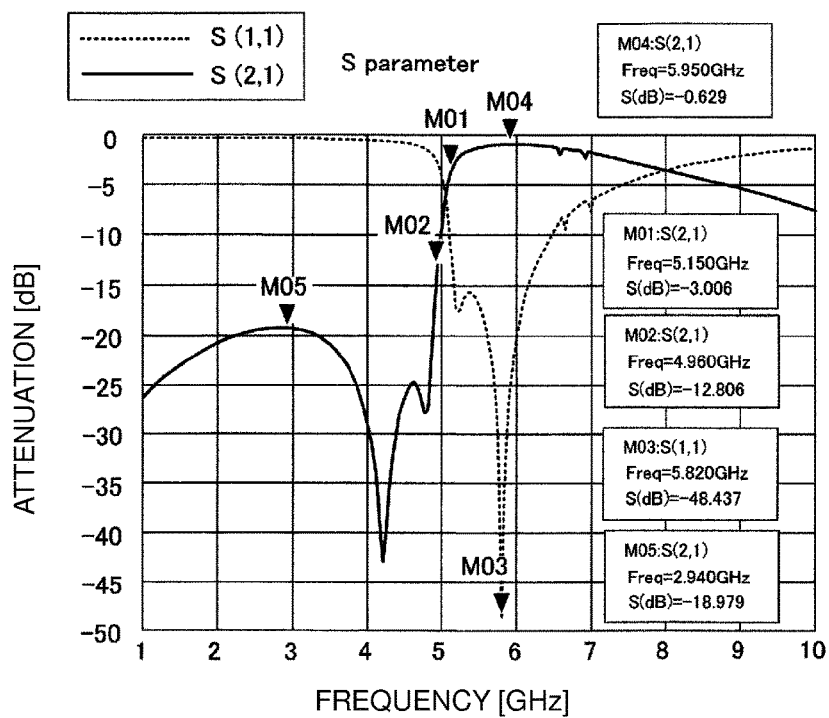
FIG. 8 is a graph showing a frequency response of the multilayer electronic component according to the comparative example.

FIG. 8 shows a frequency response of the multilayer electronic component 1300 according to the comparative example.

As shown in FIGS. 5 and 8, for both of the multilayer electronic component 100 and the multilayer electronic component 1300, the attenuation in the S(2,1) characteristic was measured at about 5.150 GHz (M01) and about 5.950 GHz (M04) within the pass band and at about 4.960 GHz (M02) and about 2.940 GHz (M05) outside the pass band. Also, for both of the multilayer electronic component 100 and the multilayer electronic component 1300, the attenuation at the pole (M03) in the S(1,1) characteristic was measured.

As can be seen in FIGS. 5 and 8, the attenuation at about 5.150 GHz (M01) within the pass band was about −3.006 dB in the multilayer electronic component 1300 and about −3.000 dB in the multilayer electronic component 100; that is, the attenuation in the multilayer electronic component 100 was smaller than that in the multilayer electronic component 1300. On the other hand, the attenuation at about 4.960 GHz (M02) outside the pass band was about −12.806 dB in the multilayer electronic component 1300 and about −13.541 dB in the multilayer electronic component 100; that is, the attenuation in the multilayer electronic component 100 was larger than that in the multilayer electronic component 1300. Thus, the multilayer electronic component 100 has better filter characteristics and a lower insertion loss than the multilayer electronic component 1300. This is likely because, in the multilayer electronic component 100, the linear conductor trace 6c is displaced to reduce unwanted capacitance between the linear conductor trace 6a and the linear conductor trace 6c and increase the quality factor of the inductor L1 and, at the same time, the linear conductor trace 7c is displaced to reduce unwanted capacitance between the linear conductor trace 7a and the linear conductor trace 7c and increase the quality factor of the inductor L2.

Second Preferred Embodiment

Figure 9:
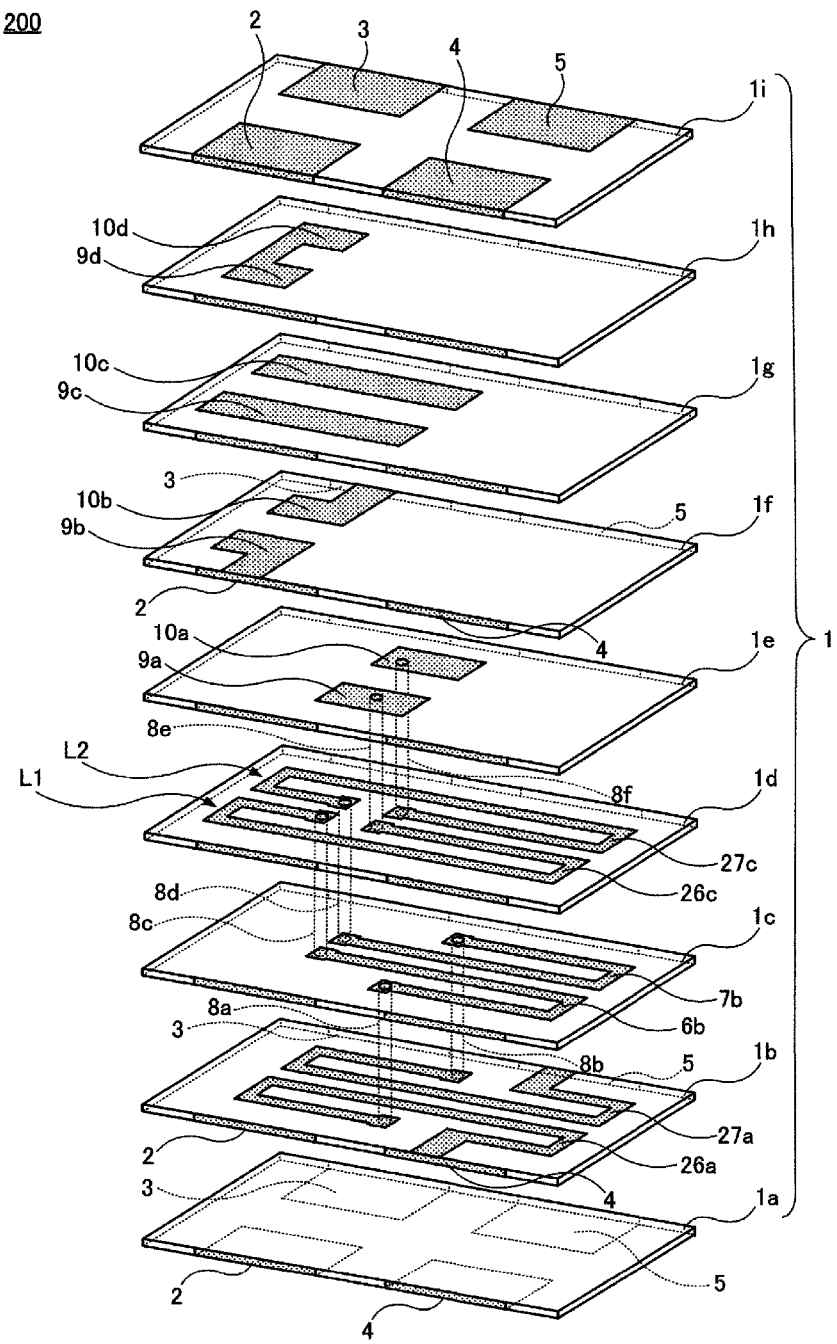
FIG. 9 is an exploded perspective view of a multilayer electronic component according to a second preferred embodiment of the present invention.
Figure 10:
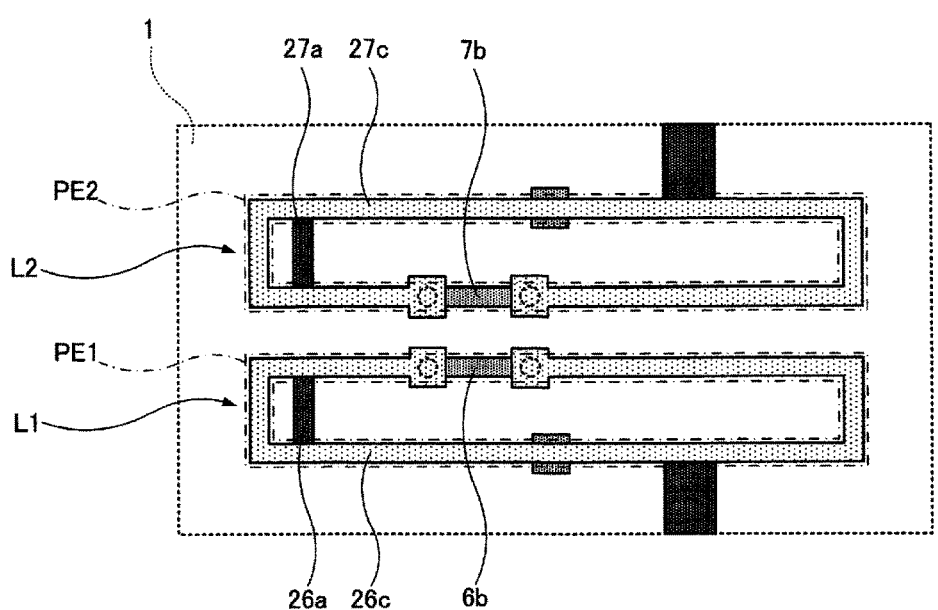
FIG. 10 is a perspective plan view of the multilayer electronic component according to the second preferred embodiment of the present invention.

FIGS. 9 and 10 illustrate a multilayer electronic component 200 according to a second preferred embodiment of the present invention. Specifically, FIG. 9 is an exploded perspective view of the multilayer electronic component 200, and FIG. 10 is a perspective plan view of the multilayer electronic component 200. In the multilayer electronic component 200, the same or similar elements as those of the multilayer electronic component 100 according to the first preferred embodiment are denoted by the same reference numerals, and only elements different from those of the multilayer electronic component 100 are denoted by different reference numerals.

The multilayer electronic component 200 is obtained by modifying the multilayer electronic component 100 according to the first preferred embodiment. Specifically, in the multilayer electronic component 100, as illustrated in FIGS. 2 and 3, the linear conductor traces 6c and 7c provided on the upper principal surface of the insulator layer 1d are partially displaced inwardly from the linear conductor trace regions PE1 and PE2, respectively. On the other hand, in the multilayer electronic component 200, linear conductor traces 26c and 27c provided on the upper principal surface of the insulator layer 1d are not displaced from the linear conductor trace regions PE1 and PE2 and, instead, linear conductor traces 26a and 27a provided on the upper principal surface of the insulator layer 1b are partially displaced inwardly from the linear conductor trace regions PE1 and PE2, respectively.

In the multilayer electronic component 200, the area where the linear conductor traces 26a and 26c are superimposed is also reduced, and the capacitance produced between the linear conductor traces 26a and 26c is reduced. This increases the quality factor of the inductor L1. Similarly, the area where the linear conductor traces 27a and 27c are superimposed is reduced, and the capacitance produced between the linear conductor traces 27a and 27c is reduced. This increases the quality factor of the inductor L2.

Figure 11:
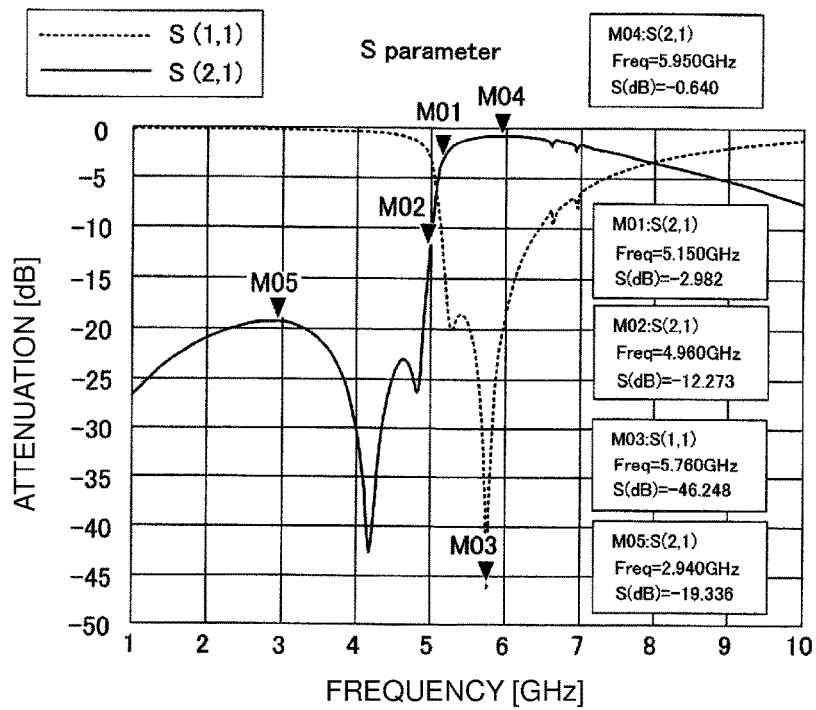
FIG. 11 is a graph showing a frequency response of the multilayer electronic component according to the second preferred embodiment of the present invention.

FIG. 11 shows a frequency response of the multilayer electronic component 200.

As can be seen from the comparison of FIG. 11 with FIG. 5 showing the frequency response of the multilayer electronic component 100, the attenuation at about 5.950 GHz (M04) within the pass band was about −0.666 dB in the multilayer electronic component 100 and about −0.640 dB in the multilayer electronic component 200; that is, the attenuation in the multilayer electronic component 200 was smaller than that in the multilayer electronic component 100. The multilayer electronic component 200 also has a good frequency response and a low insertion loss.

Third Preferred Embodiment

Figure 12:
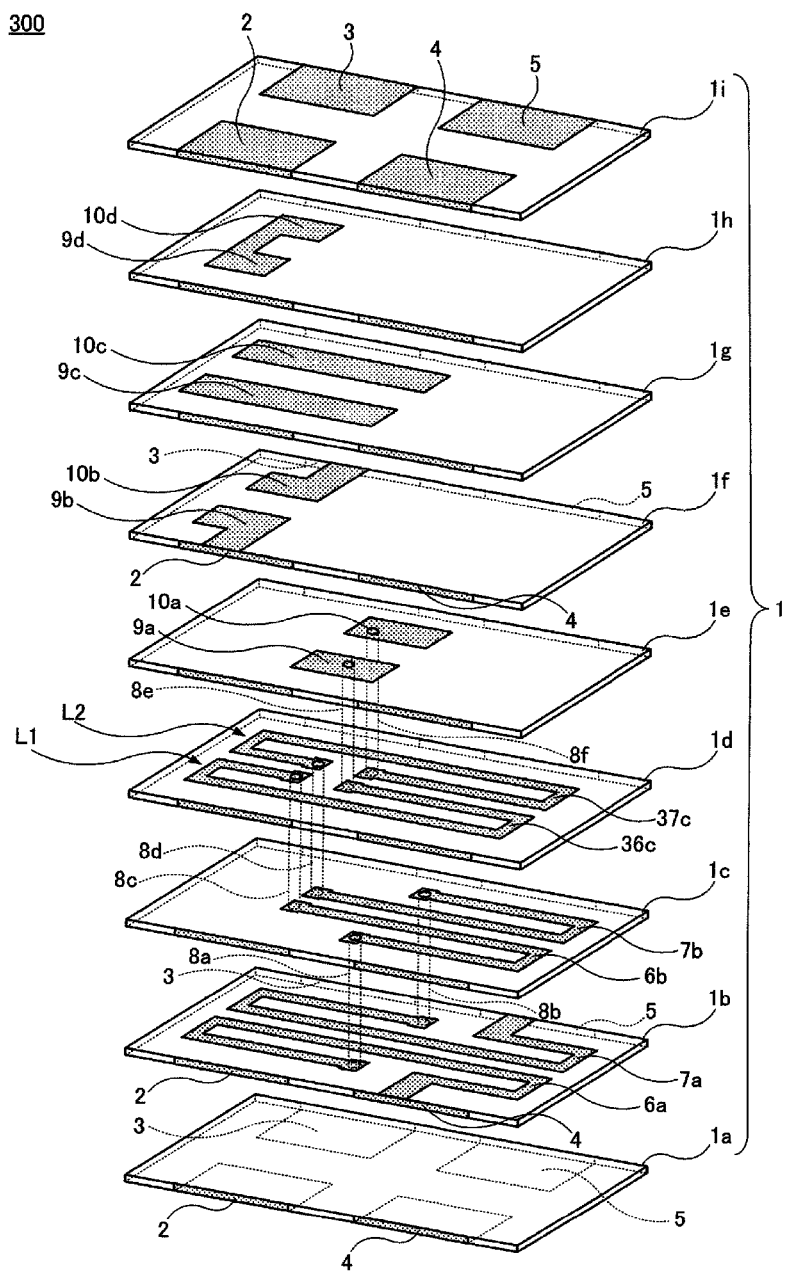
FIG. 12 is an exploded perspective view of a multilayer electronic component according to a third preferred embodiment of the present invention.
Figure 13:
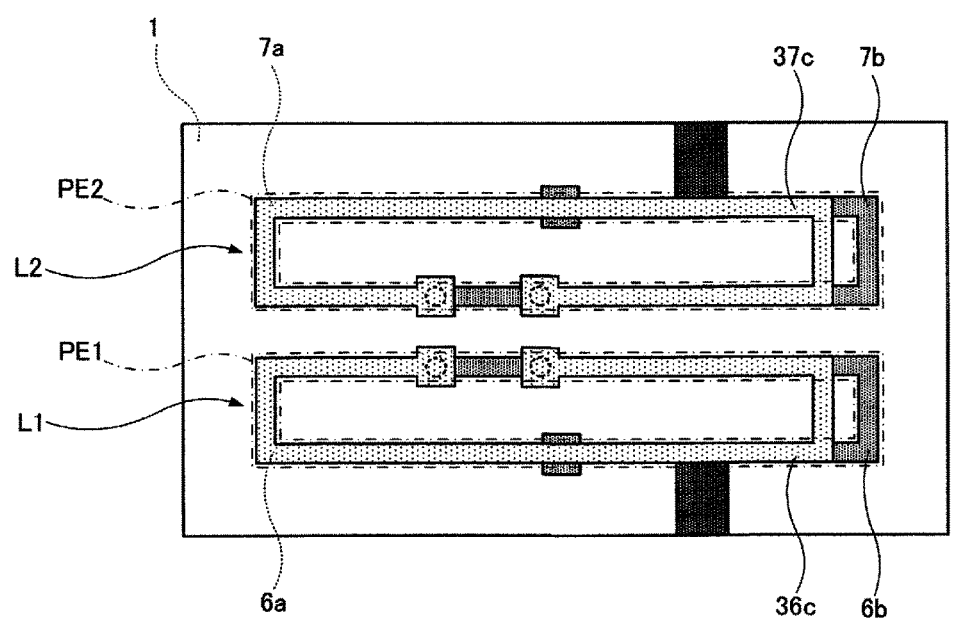
FIG. 13 is a perspective plan view of the multilayer electronic component according to the third preferred embodiment of the present invention.

FIGS. 12 and 13 illustrate a multilayer electronic component 300 according to a third preferred embodiment of the present invention. Specifically, FIG. 12 is an exploded perspective view of the multilayer electronic component 300, and FIG. 13 is a perspective plan view of the multilayer electronic component 300. In the multilayer electronic component 300, the same or similar elements as those of the multilayer electronic component 100 according to the first preferred embodiment are denoted by the same reference numerals, and only elements different from those of the multilayer electronic component 100 are denoted by different reference numerals.

The multilayer electronic component 300 is also obtained by modifying the multilayer electronic component 100 according to the first preferred embodiment.

In the multilayer electronic component 100, as illustrated in FIG. 2, the capacitor conductor traces 9a to 9d and 10a to 10d are eccentrically located to one side (i.e., left-hand side in FIG. 2) of the multilayer body 1. The multilayer electronic component 300 has the same or substantially the same configuration as this. That is, as illustrated in FIG. 12, the capacitor conductor traces 9a to 9d and 10a to 10d are eccentrically located to one side (i.e., left-hand side in FIG. 12) of the multilayer body 1.

In the multilayer electronic component 100, as illustrated in FIGS. 2 and 3, the linear conductor traces 6c and 7c provided on the upper principal surface of the insulator layer 1d are displaced inwardly from the linear conductor trace regions PE1 and PE2, respectively, on the one side (i.e., left-hand side in FIG. 2) of the multilayer body 1 to which the capacitor conductor traces 9a to 9d and 10a to 10d are eccentrically located. On the other hand, in the multilayer electronic component 300, as illustrated in FIGS. 12 and 13, linear conductor traces 36c and 37c provided on the upper principal surface of the insulator layer 1d are displaced inwardly from the linear conductor trace regions PE1 and PE2, respectively, on the other side (i.e., right-hand side in FIG. 12) of the multilayer body 1 to which the capacitor conductor traces 9a to 9d and 10a to 10d are not eccentrically located. The linear conductor traces 36c and 37c are not displaced and are located within the linear conductor trace regions PE1 and PE2, respectively, on the one side (i.e., left-hand side in FIG. 12) to which the capacitor conductor traces 9a to 9d and 10a to 10d are eccentrically located.

In the multilayer electronic component 300, the area where the linear conductor traces 6b and 36c are superimposed is reduced, and the capacitance produced between the linear conductor traces 6b and 36c is reduced. This increases the quality factor of the inductor L1. Similarly, the area where the linear conductor traces 7b and 37c are superimposed is reduced, and the capacitance produced between the linear conductor traces 7b and 37c is reduced. This increases the quality factor of the inductor L2.

Figure 14:
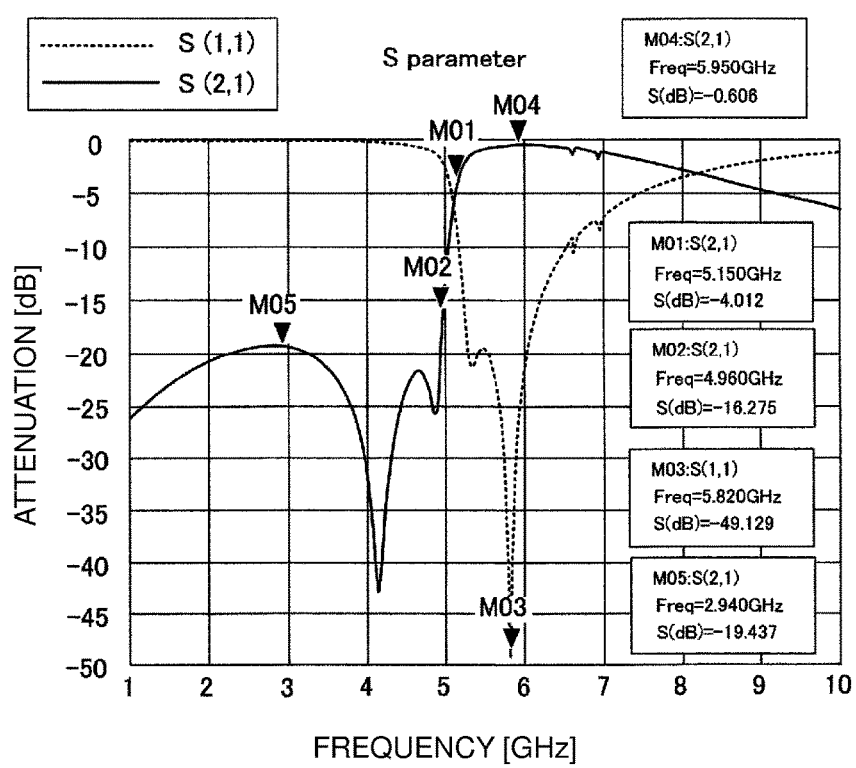
FIG. 14 is a graph showing a frequency response of the multilayer electronic component according to the third preferred embodiment of the present invention.

FIG. 14 shows a frequency response of the multilayer electronic component 300.

As can be seen from the comparison of FIG. 14 with FIG. 5 showing the frequency response of the multilayer electronic component 100, the frequency at the pole (M03) in the S(1,1) characteristic of the multilayer electronic component 300 is shifted toward higher frequencies than in the multilayer electronic component 100. Specifically, the frequency at the pole (M03) in the S(1,1) characteristic of the multilayer electronic component 100 is about 5.740 GHz, whereas the frequency at the pole (M03) in the S(1,1) characteristic of the multilayer electronic component 300 is about 5.820 GHz.

With the structure of the multilayer electronic component 300, the frequency at the pole (M03) in the S(1,1) characteristic is able to be shifted towards higher frequencies. The pole (M03) in the S(1,1) characteristic is primarily produced by the capacitance of the series resonator on the input side. In the multilayer electronic component 300, the frequency at the pole (M03) in the S(1,1) characteristic is shifted towards higher frequencies, likely because the capacitance between the linear conductor traces 6b and 36c of the inductor L1 and the capacitance between the linear conductor traces 7b and 37c of the inductor L2 are reduced.

In the multilayer electronic component 300, the attenuation at about 5.950 GHz (M04) within the pass band is about −0.606 dB, which is smaller than about −0.666 dB in the multilayer electronic component 100.

The multilayer electronic component 300 also has a good frequency response and a low insertion loss.

Fourth Preferred Embodiment

Figure 15:
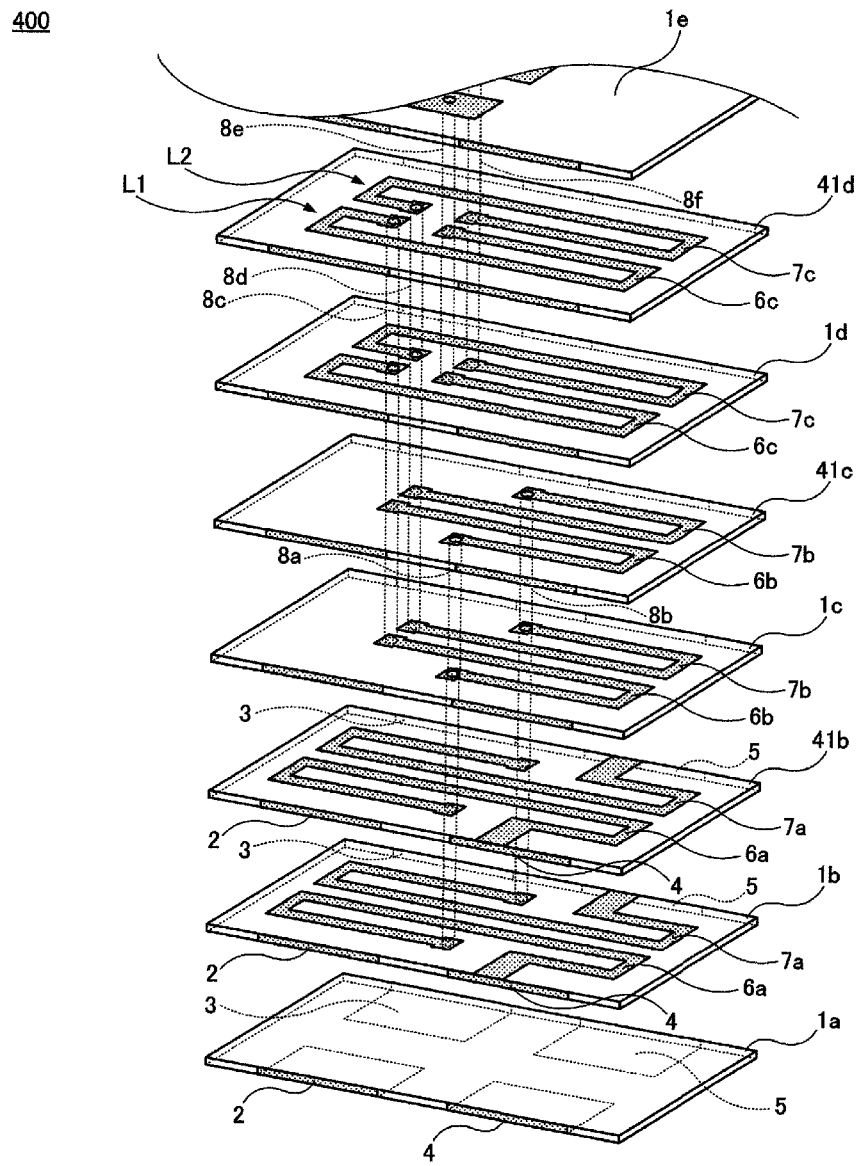
FIG. 15 is an exploded perspective view of a main portion of a multilayer electronic component according to a fourth preferred embodiment of the present invention.
Figure 16:
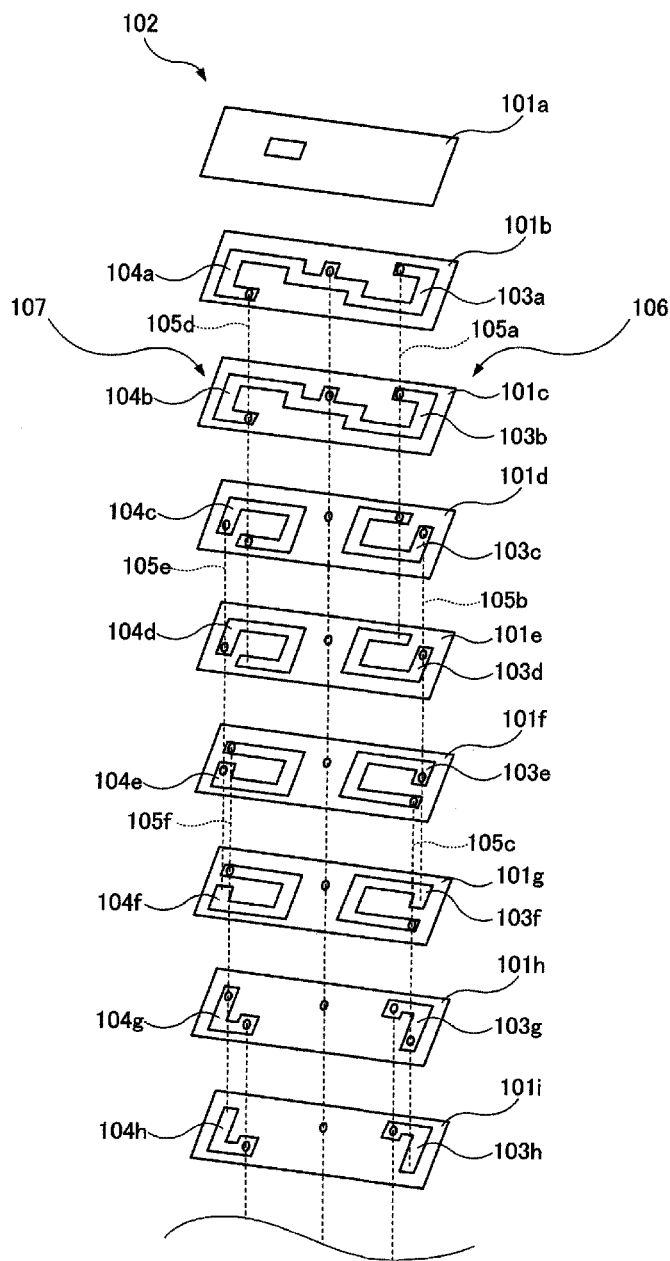
FIG. 16 is an exploded perspective view of a main portion of a multilayer electronic component described in International Publication No. WO2016/152205 A1.
Figure 17A:
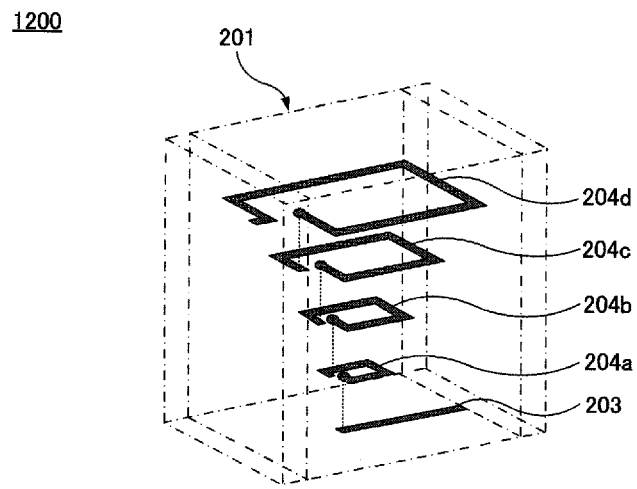
FIG. 17A is a transparent perspective view of a multilayer electronic component described in Japanese Unexamined Patent Application Publication No. 2003-309011.
Figure 17B:
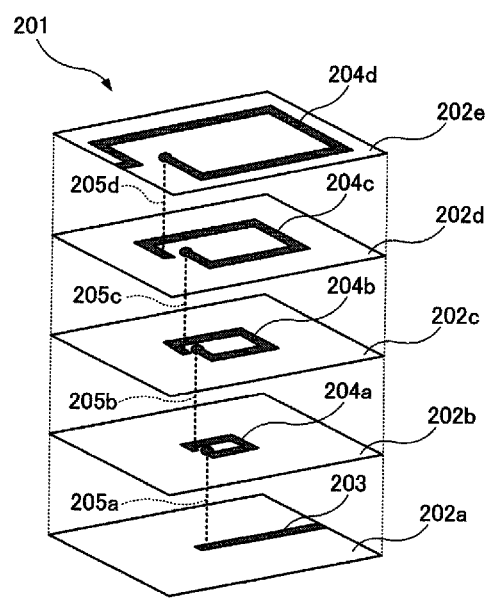
FIG. 17B is an exploded perspective view of a main portion of the multilayer electronic component illustrated in FIG. 17A.

FIG. 15 illustrates a multilayer electronic component 400 according to a fourth preferred embodiment of the present invention. Specifically, FIG. 15 is an exploded perspective view of a main portion of the multilayer electronic component 400. In FIG. 15, the insulator layers 1f to 1i stacked above the insulator layer 1e are not shown. In the multilayer electronic component 400, the same or similar elements as those of the multilayer electronic component 100 according to the first preferred embodiment are denoted by the same reference numerals, and only elements different from those of the multilayer electronic component 100 are denoted by different reference numerals.

The multilayer electronic component 400 is obtained by adding some elements to the multilayer electronic component 100 according to the first preferred embodiment. Specifically, an insulator layer 41b with the same or substantially the same configuration as the insulator layer 1b of the multilayer electronic component 100 is added between the insulator layers 1b and 1c of the multilayer electronic component 100. Similarly, an insulator layer 41c with the same or substantially the same configuration as the insulator layer 1c is added between the insulator layers 1c and 1d, and an insulator layer 41d with the same or substantially the same configuration as the insulator layer 1d is added between the insulator layers 1d and 1e. That is, similar to the multilayer electronic component 1100 disclosed in International Publication No. WO2016/152205 A1, the multilayer electronic component 400 includes the inductor L1 defined by the linear conductor traces 6a to 6c provided in pairs, and also includes the inductor L2 defined by the linear conductor traces 7a to 7c provided in pairs. The relationship of connection will now be described in more detail.

The inductor L1 is preferably provided by connecting, with the via conductor 8a, the second ends of a pair of linear conductor traces 6a to the first ends of a pair of linear conductor traces 6b and also connecting, with the via conductor 8c, the second ends of the pair of linear conductor traces 6b to the first ends of a pair of linear conductor traces 6c. Similarly, the inductor L2 is preferably provided by connecting, with the via conductor 8b, the second ends of a pair of linear conductor traces 7a to the first ends of a pair of linear conductor traces 7b and also connecting, with the via conductor 8d, the second ends of the pair of linear conductor traces 7b to the first ends of a pair of linear conductor traces 7c.

In the multilayer electronic component 400, the linear conductor traces 6a to 6c of the inductor L1 are preferably provided in pairs to reduce internal resistance, and this further increases the quality factor of the inductor L1. Also, the linear conductor traces 7a to 7c of the inductor L2 are preferably provided in pairs to reduce internal resistance, and this also further increases the quality factor of the inductor L2. The linear conductor traces 6a to 6c and 7a to 7c may be provided in sets of about three or more, instead of in pairs.

The multilayer electronic components 100, 200, 300, and 400 according to the first to fourth preferred embodiments have been described. However, the present invention is not limited to the preferred embodiments described above, and various changes may be made in accordance with the present invention.

For example, although the multilayer electronic components 100, 200, 300, and 400 according to the first to fourth preferred embodiments are preferably multilayer LC filters (multilayer LC high pass filters), the multilayer electronic components according to preferred embodiments of the present invention are not limited to multilayer LC filters and may be multilayer electronic components of other types. The multilayer electronic component does not necessarily need to include a capacitor, as long as it includes an inductor. For example, the multilayer electronic component according to preferred embodiments of the present invention may be a multilayer inductor. Even when the multilayer electronic component of the present invention is a multilayer LC filter, it is not limited to multilayer LC high pass filters and may be of other types, such as multilayer LC low pass filters or multilayer LC band pass filters.

Although the multilayer electronic components 100, 200, 300, and 400 according to the first to fourth preferred embodiments each preferably include two inductors L1 and L2, they may each include any number of inductors. That is, the number of inductors may be one, three, or more. The number of turns of each inductor may also be any number, and is not limited to that described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer electronic component comprising:
a multilayer body including a plurality of insulator layers that are stacked in a stacking direction;
a plurality of linear conductor traces each provided between two adjacent ones of the plurality of insulator layers; and
a plurality of via conductors each passing through at least a corresponding one of the plurality of insulator layers; herein
the plurality of linear conductor traces are connected by corresponding ones of the plurality of via conductors to define a helical or substantially helical inductor in the multilayer body; and
when viewed in the stacking direction of the multilayer body, all of the plurality of linear conductor traces, except at least one linear conductor trace, are superimposed within an annular or substantially annular linear conductor trace region; and
a portion of the at least one linear conductor trace is displaced inwardly or outwardly from the annular or substantially annular linear conductor trace region, and a remaining portion of the at least one linear conductor trace is disposed within the annular or substantially annular linear conductor trace region.

2. The multilayer electronic component according to claim 1, wherein a plurality of helical or substantially helical inductors are provided in the multilayer body.

3. The multilayer electronic component according to claim 1, further comprising:
a plurality of capacitor conductor traces; wherein
two opposite ones of the plurality of capacitor conductor traces define at least one capacitor; and
when viewed in a direction perpendicular or substantially perpendicular to the stacking direction of the multilayer body, the capacitor is disposed above or below a portion where the inductor is provided.

4. The multilayer electronic component according to claim 3, wherein when viewed in the direction perpendicular or substantially perpendicular to the stacking direction of the multilayer body, a portion of the linear conductor trace disposed closest to the capacitor conductor traces defining the capacitor is displaced inwardly or outwardly from the annular or substantially annular linear conductor trace region.

5. The multilayer electronic component according to claim 3, wherein when viewed in the direction perpendicular or substantially perpendicular to the stacking direction of the multilayer body, a portion of the linear conductor trace spaced from the capacitor conductor traces defining the capacitor, with at least one linear conductor trace interposed therebetween, is displaced inwardly or outwardly from the annular or substantially annular linear conductor trace region.

6. The multilayer electronic component according to claim 3, wherein when viewed in the stacking direction of the multilayer body,
the multilayer body is rectangular or substantially rectangular in shape;
the capacitor is eccentrically located to one side of the rectangular or substantially rectangular multilayer body; and
on the one side of the multilayer body to which the capacitor is eccentrically located, the portion of the at least one linear conductor trace is displaced inwardly or outwardly from the annular or substantially annular linear conductor trace region.

7. The multilayer electronic component according to claim 3, wherein when viewed in the stacking direction of the multilayer body,
the multilayer body is rectangular or substantially rectangular in shape;
the capacitor is eccentrically located to one side of the rectangular or substantially rectangular multilayer body; and
on a side opposite to the one side of the multilayer body to which the capacitor is eccentrically located, the portion of the at least one linear conductor trace is displaced inwardly or outwardly from the annular or substantially annular linear conductor trace region.

8. The multilayer electronic component according to claim 3, wherein when viewed in the stacking direction of the multilayer body,
the multilayer body is rectangular or substantially rectangular in shape;
the capacitor is eccentrically located to one side of the rectangular or substantially rectangular multilayer body; and
on a side opposite to the one side of the multilayer body to which the capacitor is eccentrically located, the portion of the at least one linear conductor trace is displaced inwardly or outwardly from the annular or substantially annular linear conductor trace region.

9. A multilayer LC filter comprising the multilayer electronic component according to claim 3, wherein the inductor and the capacitor define an LC filter circuit.

10. The multilayer LC filter according to claim 9, wherein when viewed in the direction perpendicular or substantially perpendicular to the stacking direction of the multilayer body, a portion of the linear conductor trace disposed closest to the capacitor conductor traces defining the capacitor is displaced inwardly or outwardly from the annular or substantially annular linear conductor trace region.

11. The multilayer LC filter according to claim 9, wherein when viewed in the direction perpendicular or substantially perpendicular to the stacking direction of the multilayer body, a portion of the linear conductor trace spaced from the capacitor conductor traces defining the capacitor, with at least one linear conductor trace interposed therebetween, is displaced inwardly or outwardly from the annular or substantially annular linear conductor trace region.

12. The multilayer LC filter according to claim 9, wherein when viewed in the stacking direction of the multilayer body,
   the multilayer body is rectangular or substantially rectangular in shape;
   the capacitor is eccentrically located to one side of the rectangular or substantially rectangular multilayer body; and
   on the one side of the multilayer body to which the capacitor is eccentrically located, the portion of the at least one linear conductor trace is displaced inwardly or outwardly from the annular or substantially annular linear conductor trace region.

13. The multilayer LC filter according to claim 9, further comprising:
   input-output terminals and ground terminals provided on side surfaces of the multilayer body.

14. The multilayer LC filter according to claim 13, wherein the input-output terminals and the ground terminals each extend at a first end thereof to a bottom surface of the multilayer body, and extend at a second end thereof to a top surface of the multilayer body.

15. The multilayer LC filter according to claim 13, wherein each of the input-output terminals and the ground terminals are made of Cu.

16. The multilayer LC filter according to claim 15, wherein each of the input-output terminals and the ground terminals includes one or more plating layers of Ni, Au, or Sn on a surface thereof.

17. The multilayer electronic component according to claim 1, further comprising:
   input-output terminals and ground terminals provided on side surfaces of the multilayer body.

18. The multilayer electronic component according to claim 17, wherein the input-output terminals and the ground terminals each extend at a first end thereof to a bottom surface of the multilayer body, and extend at a second end thereof to a top surface of the multilayer body.

19. The multilayer electronic component according to claim 17, wherein each of the input-output terminals and the ground terminals are made of Cu.

20. The multilayer electronic component according to claim 19, wherein each of the input-output terminals and the ground terminals includes one or more plating layers of Ni, Au, or Sn on a surface thereof.

* * * * *